US012062585B2

(12) United States Patent
Chen et al.

(10) Patent No.: US 12,062,585 B2
(45) Date of Patent: Aug. 13, 2024

(54) WAFER-LEVEL DEVICE MEASUREMENT FOR OPTICAL SENSORS

(71) Applicant: Artilux, Inc., Menlo Park, CA (US)

(72) Inventors: Chien-Yu Chen, Hsinchu County (TW); Yi-Chuan Teng, Hsinchu County (TW); Yu-Hsuan Liu, Hsinchu County (TW); Yun-Chung Na, San Jose, CA (US)

(73) Assignee: ARTILUX, INC., Menlo Park, CA (US)

( * ) Notice: Subject to any disclaimer, the term of this patent is extended or adjusted under 35 U.S.C. 154(b) by 0 days.

(21) Appl. No.: 17/942,413

(22) Filed: Sep. 12, 2022

(65) Prior Publication Data

US 2023/0120504 A1    Apr. 20, 2023

Related U.S. Application Data

(60) Provisional application No. 63/256,644, filed on Oct. 18, 2021.

(51) Int. Cl.
*H01L 21/66* (2006.01)
*G01R 31/28* (2006.01)
(Continued)

(52) U.S. Cl.
CPC .......... *H01L 22/32* (2013.01); *G01R 31/2889* (2013.01); *H01L 23/562* (2013.01); *H01L 23/585* (2013.01)

(58) Field of Classification Search
None
See application file for complete search history.

(56) References Cited

U.S. PATENT DOCUMENTS

| 8,032,030 B2 * | 10/2011 | Pessoa .................. H04W 88/14 398/115 |
| 2012/0104389 A1 | 5/2012 | Whitbread et al. |

(Continued)

FOREIGN PATENT DOCUMENTS

| CN | 104037124 A * | 9/2014 | ........... H01L 21/485 |
| JP | 3865636 B2 * | 1/2007 | ............. H01L 21/32 |
| WO | WO-2014045989 A1 * | 3/2014 | ............. H01L 22/32 |

OTHER PUBLICATIONS

Ito Rie et al_2007JP_3865636_B2_2007_English Translation (Year: 2007).*

(Continued)

*Primary Examiner* — Eman A Alkafawi
*Assistant Examiner* — Suresh K Rajaputra
(74) *Attorney, Agent, or Firm* — Dority & Manning, P.A.

(57) ABSTRACT

A wafer includes a plurality of testing dies, a plurality of non-testing dies, and a dicing region. Each testing die includes: a first active area including one or more first active devices, and one or more first device pads electrically coupled to the one or more first active devices. Each non-testing die includes: a second active area including one or more second active devices, and one or more second device pads electrically coupled to the one or more second active devices. The dicing region includes one or more testing pads electrically coupled to the one or more first device pads. The one or more testing pads are arranged to receive one or more external probes for determining one or more characteristics of the one or more first active devices of the plurality of testing dies. The plurality of non-testing dies are electrically isolated from the dicing region.

20 Claims, 7 Drawing Sheets

(51) Int. Cl.
*H01L 23/00* (2006.01)
*H01L 23/58* (2006.01)

(56) References Cited

U.S. PATENT DOCUMENTS

| | | | |
|---|---|---|---|
| 2014/0145346 A1* | 5/2014 | Chen | H01L 21/76877 |
| | | | 257/734 |
| 2014/0363153 A1 | 12/2014 | McShane et al. | |
| 2015/0287656 A1* | 10/2015 | Killingsworth | H01L 22/32 |
| | | | 438/15 |
| 2019/0139841 A1* | 5/2019 | Stamper | H01L 23/544 |
| 2022/0052009 A1* | 2/2022 | Huang | H01L 23/49811 |
| 2022/0359395 A1 | 11/2022 | Ho et al. | |
| 2022/0415723 A1 | 12/2022 | Agarwal et al. | |

OTHER PUBLICATIONS

Lin et al_CN_104037124_A_2014_English Translation (Year: 2014).*
Washiya_WO_2014045989_A1_English Translation (Year: 2014).*

* cited by examiner

WAFER-LEVEL DEVICE MEASUREMENT FOR OPTICAL SENSORS

RELATED APPLICATIONS

The present application claims filing benefit of U.S. Provisional Patent Application Ser. No. 63/256,644 having a filing date of Oct. 18, 2021. Such application is incorporated herein by reference in its entirety.

FIELD

The present disclosure relates generally to wafer-level device measurement technology for use with optical sensors (e.g., photodetectors) and related applications.

BACKGROUND

Optical sensors are being used in many applications, such as smartphones, wearables, robotics, and autonomous vehicles, etc. for object recognition, image enhancement, material recognition, and other relevant applications. A particular type of optical sensor, also referred to as a photodetector, may be used to detect optical signals and convert the optical signals to electrical signals that may be further processed by other circuitry. Photodetectors may be especially useful in consumer electronics products, proximity sensing, image sensors, data communications, direct or indirect time-of-flight (TOF) ranging or imaging sensors, and many other suitable applications.

SUMMARY

Aspects and advantages of embodiments of the present disclosure will be set forth in part in the following description, or may be learned from the description, or may be learned through practice of the embodiments.

One example aspect of the present disclosure is directed to a wafer including a plurality of testing dies, a plurality of non-testing dies, and a dicing region. Each testing die of the plurality of testing dies includes: (i) a first active area including one or more first active devices, and (ii) one or more first device pads electrically coupled to the one or more first active devices. Each non-testing die of the plurality of non-testing dies includes: (iii) a second active area including one or more second active devices, and (iv) one or more second device pads electrically coupled to the one or more second active devices. The dicing region includes one or more testing pads electrically coupled to the one or more first device pads. The one or more testing pads are arranged to receive one or more external probes for determining one or more characteristics of the one or more first active devices of the plurality of testing dies. The plurality of non-testing dies are electrically isolated from the dicing region.

In some implementations, the one or more first active devices and the one or more second active devices have same designs.

In some implementations, each of the plurality of testing dies and the plurality of non-testing dies comprises a seal-ring structure that surrounds the respective first active area or the respective second active area, and the one or more testing pads are arranged outside the seal-ring structure.

In some implementations, the one or more testing pads are physically coupled to the one or more first device pads via one or more wiring structures.

In some implementations, each seal-ring structure of the plurality of testing dies includes one or more openings. The one or more wiring structures are arranged to pass through the one or more openings to be physically coupled to the one or more first device pads and the one or more testing pads without electrically coupling to the respective seal-ring structure.

In some implementations, the one or more wiring structures include different wiring structures arranged at different metal layers.

In some implementations, the one or more testing pads are electrically coupled to the one or more first device pads via antennas.

In some implementations, the dicing region comprises one or more structures for wafer-dicing.

In some implementations, the one or more first active devices include a proximity sensor, a time-of-flight sensor, or a light-emitting diode.

In some implementations, the one or more characteristics of the one or more first active devices include a capacitance parameter, a resistance parameter, a crosstalk parameter, a responsivity parameter, or a bandwidth parameter.

In some implementations, the wafer includes a silicon substrate, and the one or more first active devices and the one or more second active devices comprise germanium active devices formed on the silicon substrate.

Another example aspect of the present disclosure is directed to a set of optical masks including patterns that when used on a wafer during a semiconductor fabrication process, yields a processed wafer. The processed wafer includes a plurality of testing dies, a plurality of non-testing dies, and a dicing region. Each testing die of the plurality of testing dies includes: (i) a first active area including one or more first active devices, and (ii) one or more first device pads electrically coupled to the one or more first active devices. Each non-testing die of the plurality of non-testing dies includes: (iii) a second active area including one or more second active devices, and (iv) one or more second device pads electrically coupled to the one or more second active devices. The dicing region includes one or more testing pads electrically coupled to the one or more first device pads. The one or more testing pads are arranged to receive one or more external probes for determining one or more characteristics of the one or more first active devices of the plurality of testing dies. The plurality of non-testing dies are electrically isolated from the dicing region.

In some implementations, the one or more first active devices and the one or more second active devices have same designs.

In some implementations, each of the plurality of testing dies and the plurality of non-testing dies comprises a seal-ring structure that surrounds the respective first active area or the respective second active area, and the one or more testing pads are arranged outside the seal-ring structure.

In some implementations, the one or more testing pads are physically coupled to the one or more first device pads via one or more wiring structures.

In some implementations, each seal-ring structure of the plurality of testing dies includes one or more openings. The one or more wiring structures are arranged to pass through the one or more openings to be physically coupled to the one or more first device pads and the one or more testing pads without electrically coupling to the respective seal-ring structure.

In some implementations, the one or more wiring structures include different wiring structures arranged at different metal layers.

In some implementations, the one or more testing pads are electrically coupled to the one or more first device pads via antennas.

In some implementations, the dicing region comprises one or more structures for wafer-dicing.

In some implementations, the one or more first active devices include a proximity sensor, a time-of-flight sensor, or a light-emitting diode.

In some implementations, the one or more characteristics of the one or more first active devices include a capacitance parameter, a resistance parameter, a crosstalk parameter, a responsivity parameter, or a bandwidth parameter.

In some implementations, the wafer includes a silicon substrate, and the one or more first active devices and the one or more second active devices comprise germanium active devices formed on the silicon substrate.

Another example aspect of the present disclosure is directed to a set of optical masks including first regions for defining a plurality of testing dies, second regions for defining a plurality of non-testing dies, and third regions for defining a dicing region. Each testing die defined in the first region includes: (i) a first active area comprising one or more first active devices, and (ii) one or more first device pads electrically coupled to the one or more first active devices. Each non-testing die defined in the second region includes: (iii) a second active area including one or more second active devices, and (iv) one or more second device pads electrically coupled to the one or more second active devices. The dicing region defined by the third regions include one or more testing pads electrically coupled to the one or more first device pads. The one or more testing pads are arranged to receive one or more external probes for determining one or more characteristics of the one or more first active devices of the plurality of testing dies. The plurality of non-testing dies are electrically isolated from the dicing region.

Yet another example aspect of the present disclosure is directed to a structure for wafer-level testing. The structure includes a first active area including one or more first active devices. The structure includes one or more first device pads electrically coupled to the one or more first active devices. The structure includes a dicing region including one or more testing pads electrically coupled to the one or more first device pads. The structure includes one or more wiring structures. The structure includes a seal-ring structure that surrounds the first active area and the one or more first device pads. The one or more testing pads are arranged outside the seal-ring structure. The seal-ring structure includes one or more openings. The one or more wiring structures are arranged to pass through the one or more openings to be physically coupled to the one or more first device pads and the one or more testing pads without electrically coupling to the seal-ring structure. The one or more testing pads are arranged to receive one or more external probes for determining one or more characteristics of the one or more first active devices.

A still further example aspect of the present disclosure is directed to a method of implementing wafer-level device measurement. The method includes forming a plurality of testing dies in a first region on a substrate. Each testing die is formed to include: (i) a first active area comprising one or more first active devices, and (ii) one or more first device pads. The method includes electrically coupling the one or more first device pads to the one or more first active devices. The method includes forming one or more testing pads in a dicing region located adjacent to the first region. The method includes electrically coupling the one or more testing pads within the dicing region to the one or more first device pads within the first region. The method includes applying one or more external probes to the one or more testing pads to determine one or more characteristics of the one or more first active devices of the plurality of testing dies.

In some implementations, the method includes forming a plurality of non-testing dies in a second region on the substrate. Each non-testing die is formed to include: (iii) a second active area comprising one or more second active devices, and (iv) one or more second device pads. The method includes electrically coupling the one or more second device pads to the one or more second active devices. In such implementations, the dicing region is between the first region and the second region such that electrical isolation is maintained among the second region and the dicing region.

In some implementations, the method includes forming a seal-ring structure around the first region and/or the second region. In such implementation, the one or more testing pads are arranged outside the seal-ring structure.

In some implementations, a related method of manufacturing a plurality of products including wafer-level tested devices includes one or more of the above operations as well as dicing the substrate along one or more structures for wafer-dicing provided in the dicing region to separate the plurality of testing dies (and the optional plurality of non-testing dies) into respective devices. The method of manufacturing also includes packaging one or more of the respective devices into a product.

In some implementations, the one or more first active devices and the one or more second active devices are formed to have the same designs.

In some implementations, the method includes physically coupling the one or more testing pads to the one or more first device pads via one or more wiring structures.

In some implementations, the method includes forming each seal-ring structure of the plurality of testing dies to include one or more openings. The method includes arranging the one or more wiring structures to pass through the one or more openings. The method includes physically coupling the one or more first device pads to the one or more testing pads with the wiring structures without electrically coupling the wiring structures to the respective seal-ring structure.

In some implementations, the method includes providing multiple metal layers for the one or more wiring structures corresponding to different wiring structures arranged at different metal layers.

In some implementations, the method includes electrically coupling the one or more testing pads to the one or more first device pads via antennas.

In some implementations, the one or more first active devices include a proximity sensor, a time-of-flight sensor, or a light-emitting diode.

In some implementations, the one or more characteristics of the one or more first active devices include a capacitance parameter, a resistance parameter, a crosstalk parameter, a responsivity parameter, or a bandwidth parameter.

In some implementations, the wafer includes a silicon substrate, and the method includes forming the one or more first active devices and the one or more second active devices by forming germanium active devices on the silicon substrate.

Other example aspects of the present disclosure are directed to systems, methods, apparatuses, sensors, computing devices, tangible non-transitory computer-readable media, and memory devices related to the described technology.

These and other features, aspects and advantages of various embodiments will become better understood with reference to the following description and appended claims. The accompanying drawings, which are incorporated in and constitute a part of this specification, illustrate embodiments of the present disclosure, and together with the description, serve to explain the related principles.

BRIEF DESCRIPTION OF THE DRAWINGS

The foregoing aspects and many of the attendant advantages of this application will become more readily appreciated by reference to the following detailed description, when taken in conjunction with the accompanying drawings, wherein.

DETAILED DESCRIPTION

An optical sensor, or a photodetector, may be used to detect optical signals and convert the optical signals to electrical signals that may be further processed by another circuitry. Photodetectors may be used in consumer electronics products, proximity sensing, image sensors, data communications, direct or indirect time-of-flight (TOF) ranging or imaging sensors, and many other suitable applications.

Figure 1A:
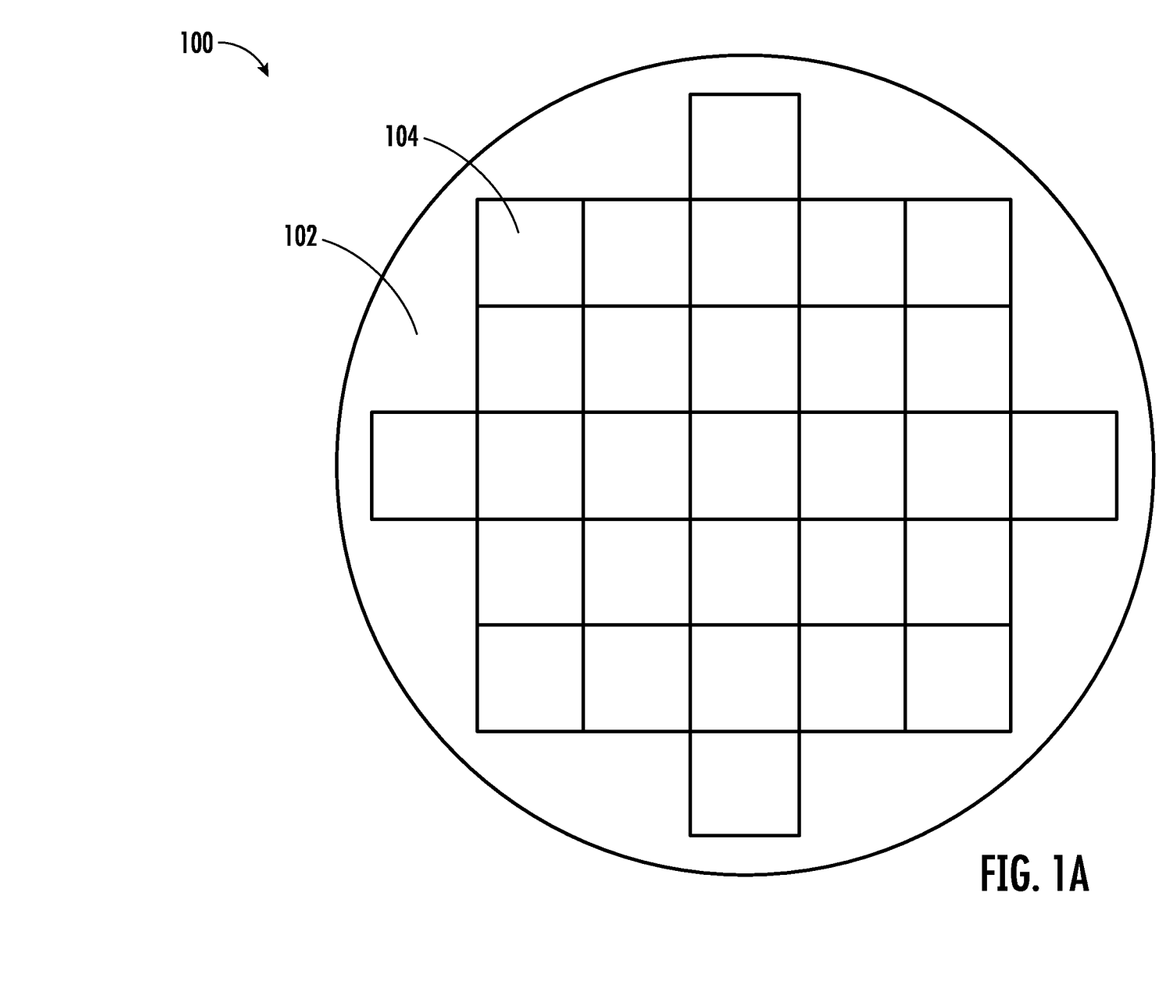
FIGS. 1A-1C illustrate schematic diagrams of examples of a wafer having structures arranged for wafer-level device measurements, according to some embodiments.
Figure 1B:
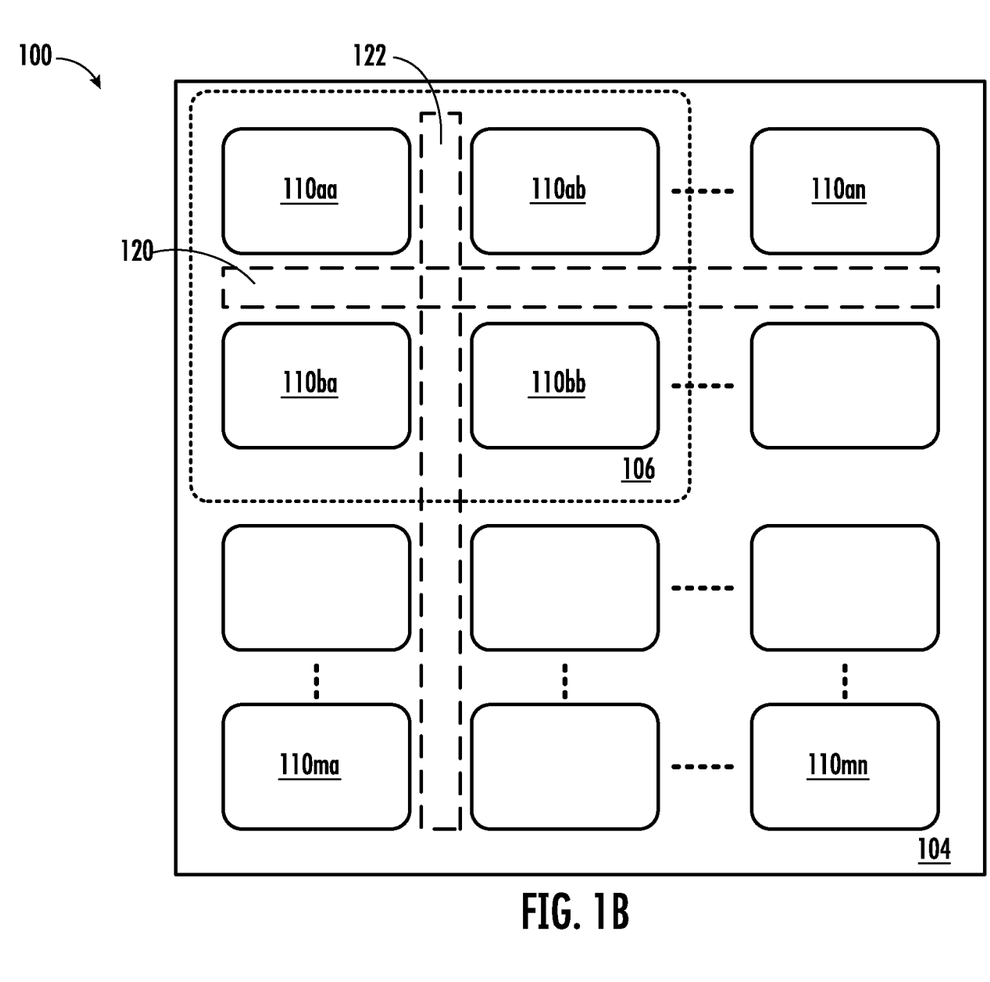

In general, these devices can be fabricated at scale on a semiconductor wafer. FIG. 1A illustrates an example wafer 100 (e.g., an 8-inch wafer, 10-inch wafer, 12-inch wafer, etc.) that includes a semiconductor substrate 102 (e.g., silicon, III-V material, or any suitable substrate material) having K exposed areas (e.g., exposed area 104), each corresponding to a reticle (or a set of optical masks) exposure, where K is any positive number (e.g., 20, 40, etc.). An example exposed area 104 is further illustrated in FIG. 1B. The exposed area 104 includes m×n dies as denoted by 110*aa* through 110*mn*, where m and n are any positive numbers (e.g., 20×20, 20×40, etc.). The exposed area 104 also includes dicing regions (e.g., dicing regions 120 and 122) arranged between dies, where a dicing region may include markers (e.g., dicing lines, optical alignment structures, etc.) arranged for separating the dies during a wafer dicing process (e.g., blade dicing, laser dicing, etc.). As illustrated in FIG. 1B, dicing regions 120 are generally arranged in a substantially perpendicular fashion to dicing regions 122. Although only a singular dicing region 120 is depicted, there may be m-1 dicing regions for m dies arranged in a first dimension (e.g., a vertical dimension). Although only a singular dicing region 122 is depicted, there may be n-1 additional dicing regions for n dies arranged in a second dimension (e.g., a horizontal dimension). A substrate portion 106 of exposed area 104 that includes a plurality of dies 110*aa*, 110*ab*, 110*ba*, 110*bb* and dicing regions 120, 122 is further described with reference to FIG. 1C.

Figure 1C:
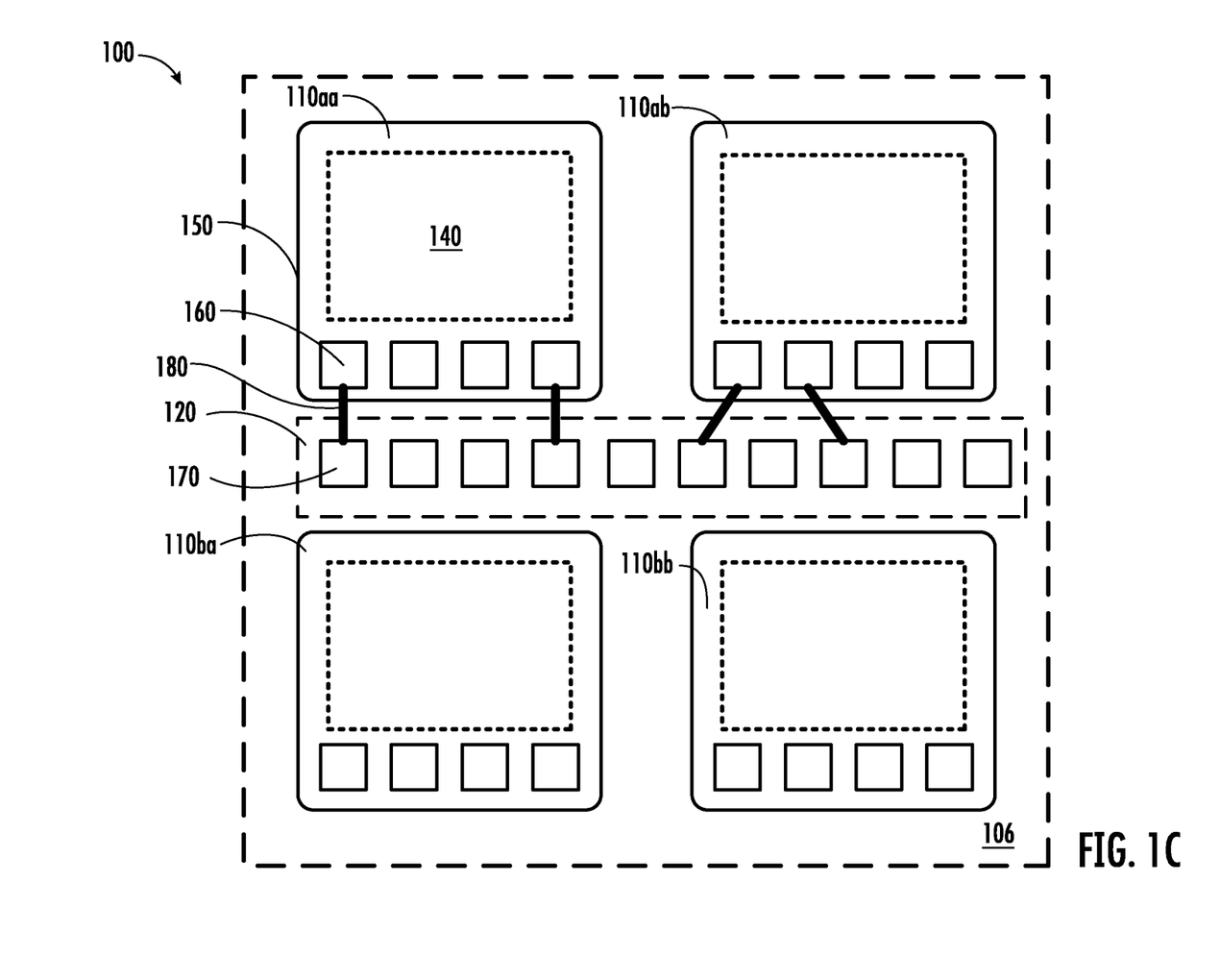

Referring to FIG. 1C as an example, each die (e.g., die 110*aa*) includes an active area (e.g., active area 140), where the active area 140 can include one or more active devices (e.g., active electronic/photonic/optoelectronic devices such as a proximity sensor, a time-of-flight sensor, a light-emitting diode, circuitry, etc.). The active area 140 can be surrounded by a seal-ring structure (e.g., seal-ring structure 150) that serves purposes such as to define die boundary for dicing indication, to reserve marginal space of dicing residues and variation tolerance, and/or to provide mechanical and electrical enclosure of fabricated semiconductor devices. Conventionally, a seal-ring structure 150 may be a continuous metal wire ring that surrounds or encloses the active area 140 and is formed on the same side of the substrate portion 106 as the active area 140. The metal wire of the seal-ring structure 150 can be formed by ion implantation and/or activation, deposition and/or patterned printing. A die 110*aa* may further include one or more pads (e.g., device pads 160) that are electrically coupled to the active devices in the active area 140, such that external electrical connections can access the active devices (e.g., wire bond during package).

In order to evaluate process and device yield after manufacturing process steps, it is important to perform wafer-level testing on the fabricated devices after the single, multiple, or all manufacturing process steps. For example, wafer acceptance test (WAT) is a statistical way to test the fabricated devices, where test structures are distributed across the wafer. These test structures are coupled to pads having predetermined dimensions (e.g., width, length, pitch, etc.), and can be measured using a probe card or other suitable testing equipment to determine one or more characteristics of the active devices such as a capacitance parameter, a resistance parameter, a crosstalk parameter, a responsivity parameter, a bandwidth parameter associated with the active devices, a breakdown voltage, or any other suitable parameters. However, if the probing is done directly on a testing die (e.g., by making physical contact between a probe on a probe card and the device pad 160 of the die 110*aa*), the overall yield of the production is decreased, as the pad of the testing die has been scratched by the probe and therefore may no longer be packaged into a product. Moreover, a standard test structure applied with the probe card that may be re-used for different products may be preferred, as a designated probe card specifically for one product may not be used for a different product, which may increase the cost and complexity of testing.

One way to address the forementioned issues is to place test structures (e.g., active devices with pads) in a dicing region (e.g., dicing region 120). However, to maximize yield and/or to conform to fabrication rules (e.g., reticle stepper pitch in-between exposures), the width of a dicing region 120 can be smaller than the dimensions of an active device (e.g., an active device in active area 140). Accordingly, test structures arranged for wafer-level device measurements that maximize device yield while achieving sufficient measurement data points for validation is desirable. Accordingly, the condition of a manufacturing process can be monitored during or after the process and the manufacturing parameters can be optimized in real time.

Referring to FIG. 1C, the substrate portion 106 of wafer 100 includes a plurality of testing dies (e.g., testing dies 110*aa*, 110*ab*). Each testing die 110*aa*, 110*ab* can include a first active area 140 including one or more first active devices. Each testing die 110*aa*, 110*ab* can include one or more first device pads 160 that are electrically coupled (e.g., via metal layers in the die) to the one or more first active devices of first active area 140.

The substrate portion 106 can also include a dicing region 120 adjacent to the plurality of testing dies 110*aa*, 110*ab* that can include one or more structures for wafer-dicing. Dicing region 120 configured as the test structure also includes one or more testing pads 170. The one or more testing pads 170 can be electrically coupled to the one or more first device pads 160. For instance, the wafer 100 can further include one or more wiring structures 180 that provide electrical coupling between the first device pads 160 and the testing pads 170. In some examples, the one or more testing pads 170 are physically coupled to the one or more first device pads 160 via the one or more wiring structures 180 formed as a bridge structure. The one or more testing pads 170 can be arranged to receive one or more external probes for determining one or more characteristics of the one or more first active devices of the plurality of testing dies 110*aa*, 110*ab*. For example, the one or more characteristics of the one or more first active devices can include a capacitance parameter, a resistance parameter, a crosstalk parameter, a responsivity parameter, or a bandwidth parameter. In some implementations, the dicing region 120 may include other test structures and/or markers for wafer dicing.

In some examples, the substrate portion 106 of wafer 100 can optionally include a plurality of non-testing dies (e.g., non-testing dies 110*ba*, 110*bb*). Each non-testing die 110*ba*, 110*bb* can include a second active area (similar to active area 140) that includes one or more second active devices. Each non-testing die 110*ba*, 110*bb* can include one or more second device pads (similar to first device pads 160) electrically coupled to the one or more second active devices of second active area. In embodiments where non-testing dies 110*ba*, 110*bb* are included within the substrate portion 106, the plurality of non-testing dies 110*ba*, 110*bb* are electrically isolated from the dicing region 120.

In some implementations, the one or more first active devices of the testing dies 110*aa*, 110*ab* and the one or more second active devices of the one or more non-testing dies 110*ba*, 110*bb* have the same designs (e.g., the same material composition, the same structure, the same dimension, etc.) and/or are manufactured during the same process. In some examples, the one or more first active devices (and optionally the one or more second active devices) can include a proximity sensor, a time-of-flight sensor, or a light-emitting diode. In some examples, wafer 100 comprises a silicon substrate, while the one or more first active devices and/or the one or more second active devices comprise germanium active devices formed on the silicon substrate.

Referring still to the substrate portion 106 of wafer 100 in FIG. 1C, each of the plurality of testing dies 110*aa*, 110*ab* and the plurality of non-testing dies 110*ba*, 110*bb* can include a seal-ring structure 150 that surrounds the respective active area 140 and corresponding device pads 160. The testing pads 170 within dicing region 120 are arranged outside the seal-ring structures 150. In an embodiment, the seal-ring structure 150 can be multi-layer structure which has multiple metal layers and multiple dielectric layers interlaced arrangement along the vertical direction. One or more device pads can be multi-layer structures which have multiple metal layers and at least one conducting via to electrically connect the multiple metal layers of the device pads.

Figure 2:
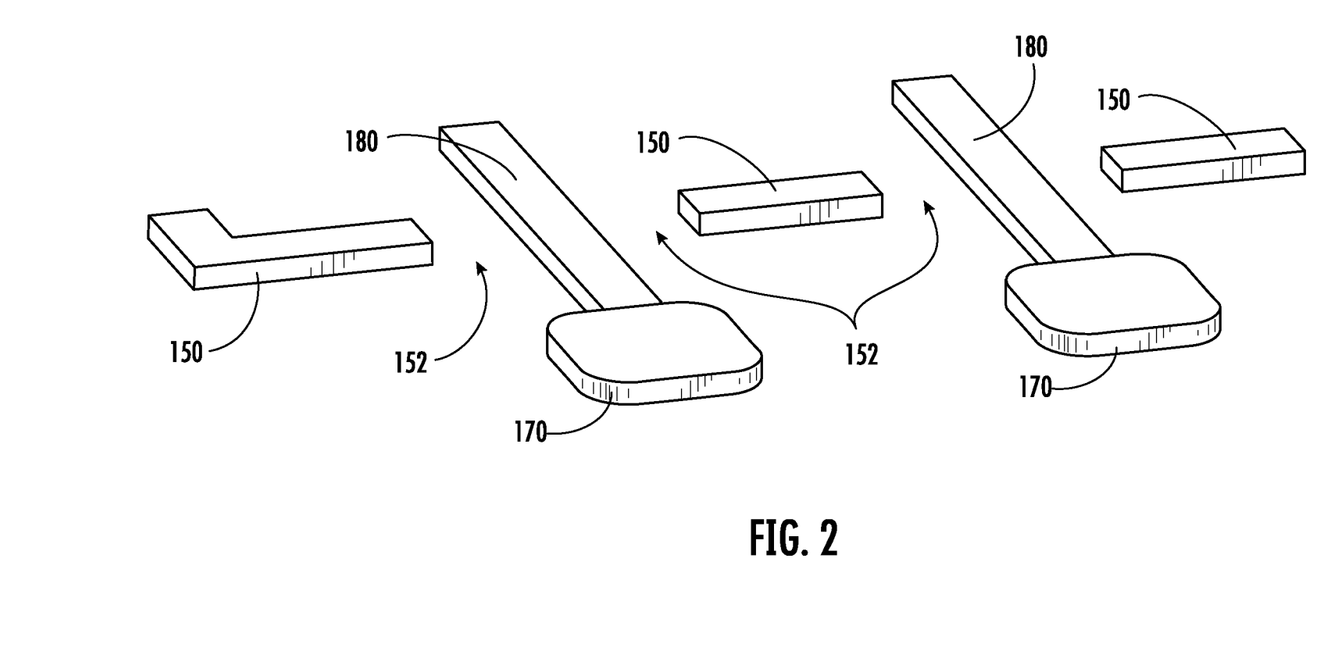
FIGS. 2-3 illustrate exploded views of examples of a test-line crossing a seal-ring structure, according to some embodiments.
Figure 3:
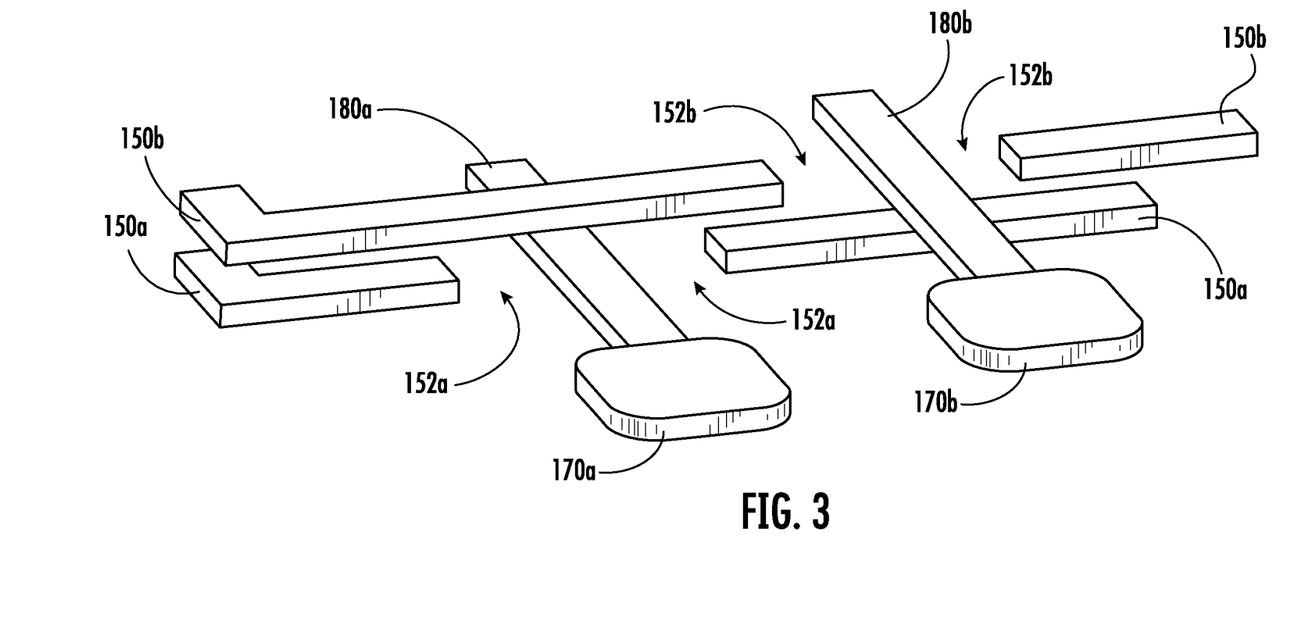

Referring now to FIGS. 2-3, examples of a test-line (e.g., wiring structure 180) crossing a seal-ring structure 150 are illustrated. In the example of FIG. 2, each seal-ring structure 150 includes a single metal layer that includes or is otherwise formed to define one or more openings 152. The one or more wiring structures 180 are arranged to pass through the one or more openings 152 to be physically coupled to the one or more device pads (e.g., first device pads 160 of FIG. 1C) and the one or more testing pads 170 without electrically coupling to the respective seal-ring structure 150. Here, the seal-ring structure 150 is modified to have openings that allow the one or more wiring structures 180 to pass. Consequently, the seal-ring structure is formed by the plurality of discrete metal layers. The plurality of discrete metal layers is formed on a same plan. In the openings 152, the one or more wiring structures 180 are distant from the seal-ring structure 150 by a gap which is filled by air or dielectric material for electrical isolation between the one or more wiring structures 180 and the seal-ring structure 150. In another embodiment, the seal-ring structure 150 can include at least one dielectric layer arranged on or under the metal layer. The openings 152 may be located at the metal layer, or in the dielectric layer. In another embodiment, the seal-ring structure 150 can be multi-layer structure which has multiple metal layers and multiple dielectric layers interlaced arrangement. The openings may be located at one of the metal layers or in one of the dielectric layers between metal layers.

In the example of FIG. 3, shows an exploded view of an example of the test-line. The seal-ring structure (150*a*, 150*b*) is a multi-layer structure which has multiple metal layers (150*a*, 150*b*) and multiple dielectric layers (not shown) interlaced arrangement. The one or more wiring structures 180 can include different portions crossing different metal layers which are located at different elevations. In other words, the seal-ring structure may include several metal layers (150*a*, 150*b*) stacked along the vertical direction and a plurality of the openings (152*a*, 152*b*) distributed on different metal layers (150*a*, 150*b*). Here, a first portion of the openings 152*a* can be located at the first metal layer 150*a*, a second portion of the openings 152*b* at the second metal layer 150*b*, and the third metal routing layer (not shown), etc. The first portion of the openings 152*a* is not overlapped with the second portion of the openings 152*b* in the top view.

More particularly, as illustrated, the seal-ring structure 150 can include a first metal layer 150*a* and a second metal layer 150*b* which are collectively formed a stack structure. The first metal layer 150*a* includes or is otherwise formed to define one or more first openings 152*a*. One or more first wiring structures 180*a* are arranged to pass through the one or more first openings 152*a* to be physically coupled to one or more device pads (e.g., first device pads 160 of FIG. 1C) and one or more first testing pads 170*a* without electrically coupling to the respective first metal layer 150*a* of seal-ring structure 150. In the openings 152*a*, the one or more wiring structures 180*a* are distant from the first metal layer 150*a* by a gap which is filled by air or dielectric material for electrical isolation between the one or more wiring structures 180*a* and the seal-ring structure. Second metal layer 150*b* is formed on top of first metal layer 150*a*. Second metal layer 150*b* includes or is otherwise formed to define one or more second openings 152*b*. One or more second wiring structures 180*b* are arranged to pass through the one or more second openings 152*b* to be physically coupled to one or more device pads (e.g., first device pads 160 of FIG. 1) and one or more second testing pads 170*b* without electrically coupling to the respective second metal layer 150*b* of seal-ring structure 150. In the openings 152*b*, the one or more wiring structures 180*b* are distant from the second metal layer 150*b* by a gap which is filled by air or dielectric material for electrical isolation between the one or more wiring structures 180*b* and the seal-ring structure. One or more first wiring structures 180a, the one or more second wiring structures 180b, the first metal layer 150a, and the second metal layer 150b are electrically isolated from each other. A dielectric material (not shown) is optionally disposed in the space between the one or more first wiring structures 180a, the one or more second wiring structures 180b, the first metal layer 150a, and the second metal layer 150b for electrical isolation. The one or more first wiring structures 180a has a horizontal offset relative to the one or more second wiring structures 180b in the top view. Hence, the parasite capacitance and the crosstalk between the first wiring structure 180a and the second wiring structure 180b can be decreased and the testing result could have better accuracy. Furthermore, the openings 152a, 152b are dispersed in different metal layers 150a, 150b, which can prevent the single metal layer from being easily cracked because too many openings are located in the same single metal layer.

Figure 4:
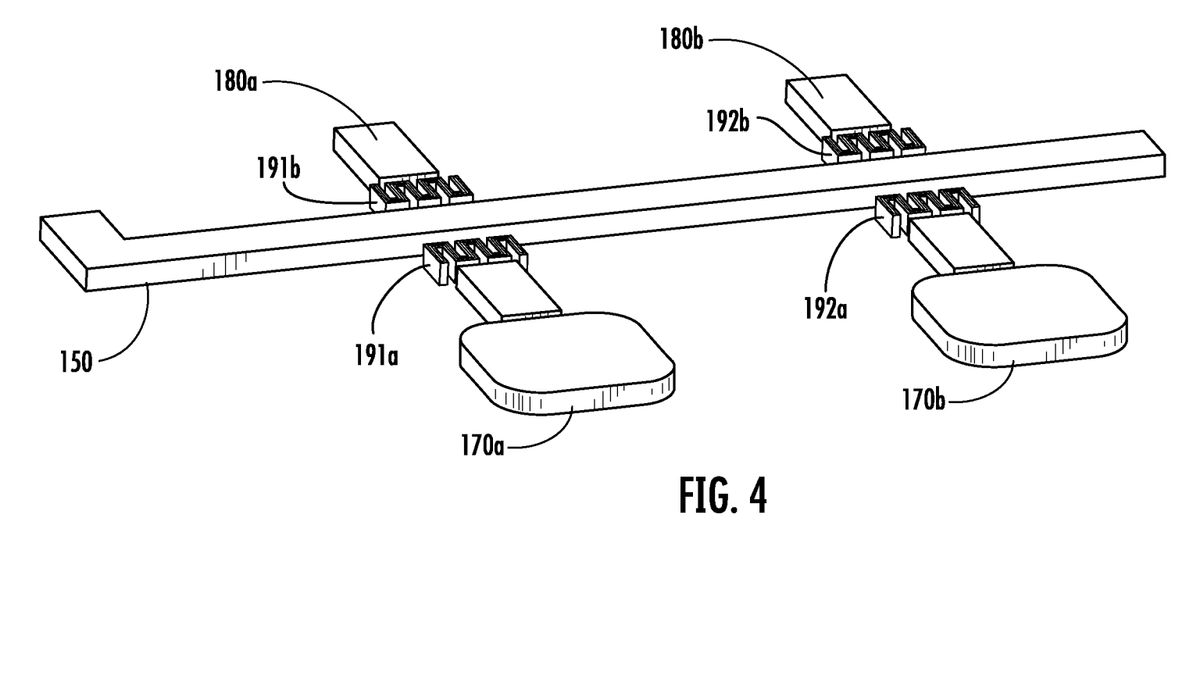
FIG. 4 illustrates a schematic diagram of an example of a test-line crossing a seal-ring structure via antennas, according to some embodiments.

In some other implementations, such as shown in the example arrangement shown in FIG. 4, the seal-ring structure 150 is formed to be a continuous metal wire ring without opening for wiring structure crossing, and the devices pads (e.g., first device pad 160 of FIG. 1C) may be electrically coupled to testing pads 170a, 170b via antennas to measure AC characteristics of the active devices. For example, a first device pad (e.g., first device pad 160 of FIG. 1C) is electrically coupled to testing pad 170a via first wiring structure 180a and first antennas 191a, 191b, and a second device pad (e.g., device pad 160 of FIG. 1C) is electrically coupled to testing pad 170b via second wiring structure 180b and second antennas 192a, 192b. The first wiring structure 180a has at least two separated portions arranged at opposite sides of the seal-ring structure 150. The one of the first antenna 191b is coupled to the first portion of the first wiring structure which is close to the device pads. Another one of the first antenna 191a is coupled to the second portion of the first wiring structure 180a which is close to the testing pad 170a. The first antennas 191a, 191b are arranged at opposite sides of the seal-ring structure 150. In an embodiment, the first antennas 191a, 191b are indirectly coupled to the first wiring structure 180a. In another embodiment, the first antennas 191a, 191b are physically coupled to the first wiring structure 180a. For example, a communication of signals is through on-chip micro-antenna structures (e.g., antennas 191a-b, 192a-b) to achieve wireless signal coupling through the conventional seal-ring structure 150. The wireless signal coupling uses an alternative current (AC) signal to couple through the micro-antennas (e.g., between antennas 191a and 191b or between antennas 192a and 192b) in order to provide the signals between the device pads and the testing pads. Similar to the wired implementations, the on-chip micro-antenna designs may be implemented at multiple metal/interlayer dielectrics structures. In detail, the micro-antenna can be a stack structure which includes multiple metal layers and/or dielectric layers. In some implementations, the crosstalk between on-chip micro-antenna structures may be optimized. For example, a Faraday shield structure placed around each testing pad 170a, 170b can be implemented, and these additional structures outside of the defined die boundary may be removed from the die after dicing. In some implementations, on-chip micro-antennas may be implemented on the device pads and/or the testing pads as well as the testing probes to wirelessly couple signals between the device pads/testing pads and the testing probes. Here, the WAT can be done directly to the product die without damaging the device pads.

In general, the wafer 100 may include a plurality of testing dies (e.g., testing die 110aa) and a plurality of non-testing dies (e.g., non-testing die 110bb), where the testing dies and the non-testing dies may have the same active device designs. The test structures located outside the seal-ring structure of the testing die may be removed after dicing, leaving a disconnected wire routing in conjunction with the seal-ring structure. Since the device pads of the diced testing die are unscratched by a probe, the diced testing die may be packaged into a product, thereby increasing the overall yield without decreasing WAT sampling.

As disclosed, the implementation of seal-ring structure may be modified into discontinuous metal pieces while still maintaining said seal-ring benefits. Designed patterns of the seal-ring structure may achieve mechanical benefits of the disclosed active devices (e.g., active electronic/photonic/optoelectronic devices such a proximity sensor, a time-of-flight sensor, a light-emitting diode, circuitry, etc.), such as: stress release upon manufacturing and/or dicing processes, mechanical adhesion to the deposited polymer/semiconductor/dielectric films, corner chipping reduction, die level handling protection, etc. Designed patterns of the seal-ring structure may achieve electrical benefits of the disclosed active devices (e.g., active electronic/photonic/optoelectronic devices such a proximity sensor, a time-of-flight sensor, a light-emitting diode, circuitry, etc.), such as electrostatic isolation and protection of contaminant/humidity/oxidizer/mobile ions.

Figure 5:
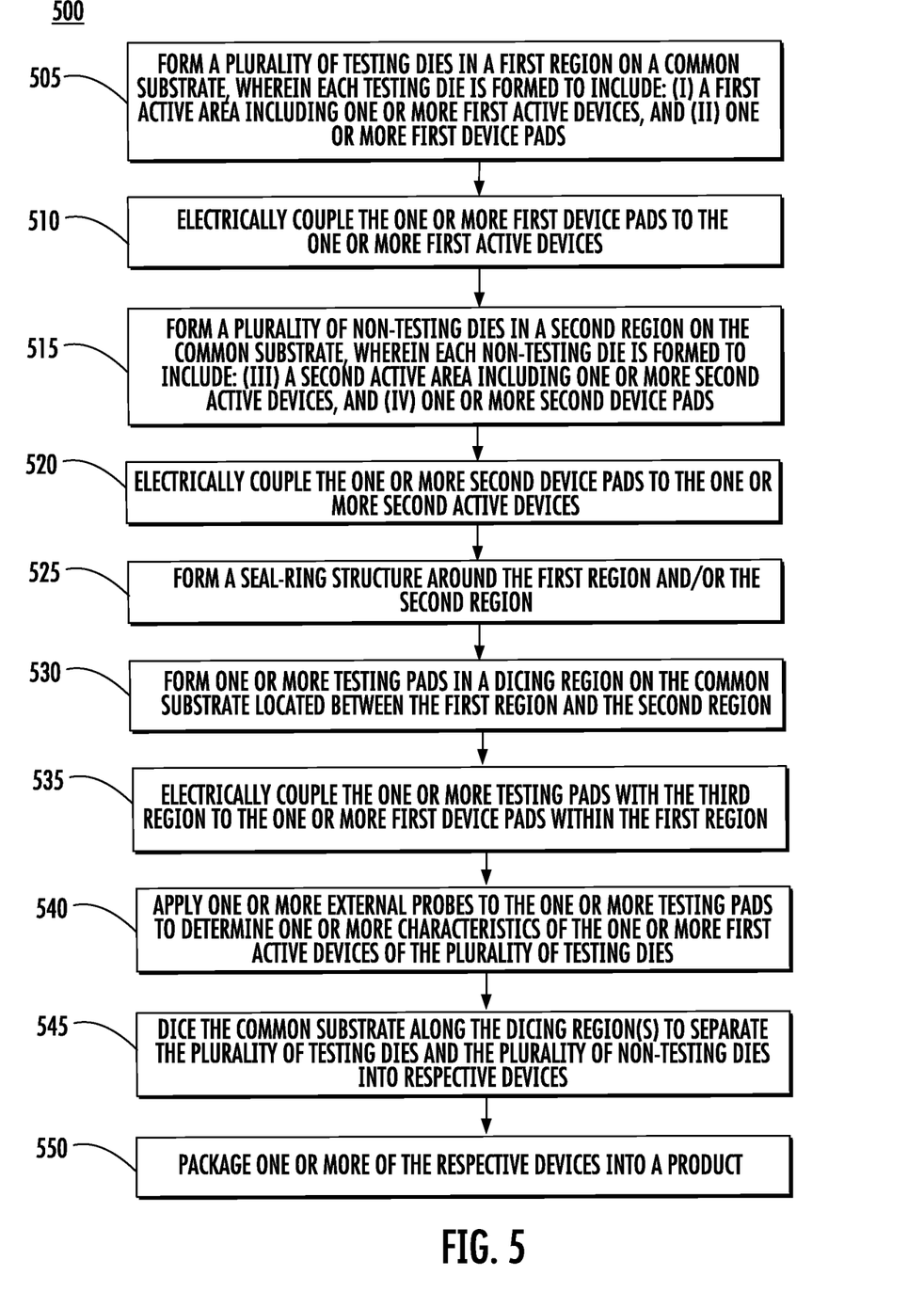
FIG. 5 illustrates a flowchart of an example method for implementing wafer-level device measurement and associated product manufacture, according to some embodiments.

Referring now to FIG. 5, an example method 500 for implementing wafer-level device measurement and associated product manufacture is depicted.

At step 505, method 500 can include forming a plurality of testing dies in a first region on a substrate. Each testing die can be formed at step 505 to include: (i) a first active area comprising one or more first active devices, and (ii) one or more first device pads. For example, the plurality of testing dies formed at step 505 can include testing dies 110aa, 110ab of FIG. 1C.

At step 510, method 500 can include electrically coupling the one or more first device pads to the one or more first active devices. For example, the one or more first device pads 160 of FIG. 1C can be electrically coupled to one or more first active devices within the first active area 140.

At step 530, the method 500 can include forming one or more testing pads in a dicing region located adjacent to the first region. For example, the one or more testing pads (e.g., testing pads 170 of FIG. 1C) can be formed in a dicing region 120.

At step 535, the method 500 can include electrically coupling the one or more testing pads within the dicing region to the one or more first device pads within the first region. For example, the one or more testing pads 170 within the dicing region 120 of FIG. 1C can be electrically coupled to the one or more first device pads 160. In some implementations, step 535 can include not only electrically coupling but also physically coupling the one or more testing pads to the one or more first device pads via one or more wiring structures.

At step 540, the method 500 can include applying one or more external probes to the one or more testing pads (e.g., testing pads 170 of FIG. 1C) to determine one or more characteristics of the one or more first active devices of the plurality of testing dies (e.g., testing dies 110aa, 110ab).

In some implementations, the method 500 includes a step 515, which includes forming a plurality of non-testing dies (e.g., non-testing dies 110ba, 110bb of FIG. 1C) in a second region on the substrate. Each non-testing die is formed to include: (iii) a second active area comprising one or more second active devices, and (iv) one or more second device pads.

In some implementations, the method 500 includes a step 520, which includes electrically coupling the one or more second device pads to the one or more second active devices. In such implementations, the dicing region is between the first region and the second region such that electrical isolation is maintained among the second region and the dicing region.

In some implementations, the method 500 includes a step 525, which includes forming a seal-ring structure (e.g., seal-ring structure 150) around the first region and/or the second region. In such implementation, the one or more testing pads 170 are arranged outside the seal-ring structure 150. In some implementations, the step 525 can include forming each seal-ring structure of the plurality of testing dies to include one or more openings. The method 500 can thus include arranging the one or more wiring structures to pass through the one or more openings as part of the step 525. The method 500 can include physically coupling the one or more first device pads to the one or more testing pads with the wiring structures without electrically coupling the wiring structures to the respective seal-ring structure as part of the step 525.

In some implementations, the method 500 includes a step 525, which includes providing multiple metal layers for the one or more wiring structures corresponding to different wiring structures arranged at different metal layers, such as depicted in FIG. 3.

In some implementations, at the step 525 of the method 500 can include electrically coupling the one or more testing pads to the one or more first device pads via antennas, such as depicted in FIG. 4.

In some implementations, a related method of manufacturing a plurality of products including wafer-level tested devices includes one or more of the above steps 505-540 as well as dicing the substrate at a step 545 along one or more dicing region to separate the plurality of testing dies (and the optional plurality of non-testing dies) into respective devices. The method of manufacturing also includes packaging at a step 550 one or more of the respective devices into a product.

Various means can be configured to perform the methods, operations, and processes described herein. For example, any of the systems and apparatuses (e.g., optical sensing apparatus and related circuitry) can include unit(s) and/or other means for performing their operations and functions described herein. In some implementations, one or more of the units may be implemented separately. In some implementations, one or more units may be a part of or included in one or more other units. These means can include processor(s), microprocessor(s), graphics processing unit(s), logic circuit(s), dedicated circuit(s), application-specific integrated circuit(s), programmable array logic, field-programmable gate array(s), controller(s), microcontroller(s), and/or other suitable hardware. The means can also, or alternately, include software control means implemented with a processor or logic circuitry, for example. The means can include or otherwise be able to access memory such as, for example, one or more non-transitory computer-readable storage media, such as random-access memory, read-only memory, electrically erasable programmable read-only memory, erasable programmable read-only memory, flash/ other memory device(s), data register(s), database(s), and/or other suitable hardware.

As used herein, the terms such as "first", "second", "third", "fourth" and "fifth" describe various elements, components, regions, layers and/or sections, these elements, components, regions, layers and/or sections should not be limited by these terms. These terms may be only used to distinguish one element, component, region, layer or section from another. The terms such as "first", "second", "third", "fourth" and "fifth" when used herein do not imply a sequence or order unless clearly indicated by the context. The terms "photo-detecting", "photo-sensing", "light-detecting", "light-sensing" and any other similar terms can be used interchangeably.

Aspects of the disclosure have been described in terms of illustrative embodiments thereof. Numerous other embodiments, modifications, and/or variations within the scope and spirit of the appended claims can occur to persons of ordinary skill in the art from a review of this disclosure. Any and all features in the following claims can be combined and/or rearranged in any way possible. Accordingly, the scope of the present disclosure is by way of example rather than by way of limitation, and the subject disclosure does not preclude inclusion of such modifications, variations or additions to the present subject matter as would be readily apparent to one of ordinary skill in the art. Moreover, terms are described herein using lists of example elements joined by conjunctions such as "and," "or," "but," etc. It should be understood that such conjunctions are provided for explanatory purposes only. Lists joined by a particular conjunction such as "or," for example, can refer to "at least one of" or "any combination of" example elements listed therein. Also, terms such as "based on" should be understood as "based at least in part on".

Those of ordinary skill in the art, using the disclosures provided herein, will understand that the elements of any of the claims discussed herein can be adapted, rearranged, expanded, omitted, combined, or modified in various ways without deviating from the scope of the present disclosure. Some of the claims are described with a letter reference to a claim element for exemplary illustrated purposes and is not meant to be limiting. The letter references do not imply a particular order of operations. For instance, letter identifiers such as (a), (b), (c), . . . , (i), (ii), (iii), . . . , etc. may be used to illustrate method operations. Such identifiers are provided for the ease of the reader and do not denote a particular order of steps or operations. An operation illustrated by a list identifier of (a), (i), etc. can be performed before, after, and/or in parallel with another operation illustrated by a list identifier of (b), (ii), etc.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A wafer comprising:
 a plurality of testing dies, each testing die comprising:
  a first active area comprising one or more first active devices; and
  one or more first device pads electrically coupled to the one or more first active devices, wherein the one or more first device pads are positioned adjacent to the first active area on the wafer;
 a plurality of non-testing dies, each non-testing die comprising:

a second active area comprising one or more second active devices; and one or more second device pads electrically coupled to the one or more second active devices;

a dicing region comprising one or more testing pads electrically coupled to the one or more first device pads, wherein the one or more testing pads are arranged to receive one or more external probes for determining one or more characteristics of the one or more first active devices of the plurality of testing dies, and wherein the plurality of non-testing dies are electrically isolated from the dicing region and electrical isolation is maintained between the dicing region and the plurality of non-testing dies through dicing of the wafer.

2. The wafer of claim 1, wherein the one or more first active devices and the one or more second active devices have same designs.

3. The wafer of claim 1, wherein each of the plurality of testing dies and the plurality of non-testing dies comprises a seal-ring structure that surrounds the respective first active area or the respective second active area, and wherein the one or more testing pads are arranged outside the seal-ring structure.

4. The wafer of claim 3, wherein the one or more testing pads are physically coupled to the one or more first device pads via one or more wiring structures.

5. The wafer of claim 4, wherein each seal-ring structure of the plurality of testing dies includes one or more openings, and wherein the one or more wiring structures are arranged to pass through the one or more openings to be physically coupled to the one or more first device pads and the one or more testing pads without electrically coupling to the respective seal-ring structure.

6. The wafer of claim 4, wherein the one or more wiring structures include different wiring structures arranged at different metal layers.

7. The wafer of claim 3, wherein the one or more testing pads are electrically coupled to the one or more first device pads via antennas.

8. The wafer of claim 1, wherein the dicing region comprises one or more structures for wafer-dicing.

9. The wafer of claim 1, wherein the one or more first active devices comprise a proximity sensor, a time-of-flight sensor, or a light-emitting diode.

10. The wafer of claim 1, wherein the one or more characteristics of the one or more first active devices include a capacitance parameter, a resistance parameter, a crosstalk parameter, a responsivity parameter, or a bandwidth parameter.

11. The wafer of claim 1, wherein the wafer comprises a silicon substrate, and wherein the one or more first active devices and the one or more second active devices comprise germanium active devices formed on the silicon substrate.

12. A set of optical masks including patterns that when used on a wafer during a semiconductor fabrication process, yields a processed wafer comprising:

a plurality of testing dies, each testing die comprising:
a first active area comprising one or more first active devices; and
one or more first device pads electrically coupled to the one or more first active devices, wherein the one or more first device pads are positioned adjacent to the first active area on the wafer;

a plurality of non-testing dies, each non-testing die comprising:
a second active area comprising one or more second active devices; and
one or more second device pads electrically coupled to the one or more second active devices;

a dicing region comprising one or more testing pads electrically coupled to the one or more first device pads, wherein the one or more testing pads are arranged to receive one or more external probes for determining one or more characteristics of the one or more first active devices of the plurality of testing dies, and wherein the plurality of non-testing dies are electrically isolated from the dicing region and electrical isolation is maintained between the dicing region and the plurality of non-testing dies through dicing of the wafer.

13. The set of optical masks of claim 12, wherein each of the plurality of testing dies and the plurality of non-testing dies comprises a seal-ring structure that surrounds the respective first active area or the respective second active area, and wherein the one or more testing pads are arranged outside the seal-ring structure.

14. The set of optical masks of claim 13, wherein the one or more testing pads are physically coupled to the one or more first device pads via one or more wiring structures.

15. The set of optical masks of claim 14, wherein each seal-ring structure of the plurality of testing dies includes one or more openings, and wherein the one or more wiring structures are arranged to pass through the one or more openings to be physically coupled to the one or more first device pads and the one or more testing pads without electrically coupling to the respective seal-ring structure.

16. The set of optical masks of claim 14, wherein the one or more wiring structures include different wiring structures arranged at different metal layers.

17. A set of optical masks, comprising:

first regions for defining a plurality of testing dies, each testing die comprising:
a first active area comprising one or more first active devices; and
one or more first device pads electrically coupled to the one or more first active devices, wherein the one or more first device pads are positioned adjacent to the first active area on the wafer;

second regions for defining a plurality of non-testing dies, each non-testing die comprising:
a second active area comprising one or more second active devices; and
one or more second device pads electrically coupled to the one or more second active devices;

third regions for defining a dicing region comprising one or more testing pads electrically coupled to the one or more first device pads, wherein the one or more testing pads are arranged to receive one or more external probes for determining one or more characteristics of the one or more first active devices of the plurality of testing dies, and wherein the plurality of non-testing dies are electrically isolated from the dicing region and electrical isolation is maintained between the dicing region and the plurality of non-testing dies through dicing of the wafer.

18. The set of optical masks of claim 17, wherein the dicing region comprises one or more structures for wafer-dicing.

19. The set of optical masks of claim 17, wherein the one or more first active devices comprise a proximity sensor, a time-of-flight sensor, or a light-emitting diode.

20. The set of optical masks of claim 17, wherein the one or more characteristics of the one or more first active devices include a capacitance parameter, a resistance parameter, a crosstalk parameter, a responsivity parameter, or a bandwidth parameter.

\* \* \* \* \*